(12) United States Patent
Hashimoto

(10) Patent No.: US 6,263,463 B1
(45) Date of Patent: Jul. 17, 2001

(54) TIMING ADJUSTMENT CIRCUIT FOR SEMICONDUCTOR TEST SYSTEM

(75) Inventor: Shinichi Hashimoto, Ageo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/171,744

(22) PCT Filed: May 10, 1996

(86) PCT No.: PCT/US96/06582

§ 371 Date: Jul. 19, 1999

§ 102(e) Date: Jul. 19, 1999

(87) PCT Pub. No.: WO97/43813

PCT Pub. Date: Nov. 20, 1997

(51) Int. Cl.[7] ................................................. G01R 31/28
(52) U.S. Cl. ......................... 714/724; 714/726; 714/32; 324/612
(58) Field of Search .................................. 714/724, 726, 714/32; 324/612

(56) References Cited

U.S. PATENT DOCUMENTS

| | | | |
|---|---|---|---|
| 4,807,147 | * 2/1989 | Halbert | 702/66 |
| 5,197,070 | * 3/1993 | Maeno | 714/736 |
| 5,371,773 | * 12/1994 | Ihara et al. | 714/724 |

* cited by examiner

Primary Examiner—Albert Decady
Assistant Examiner—Emeka J. Amanze
(74) Attorney, Agent, or Firm—Muramatsu & Associates

(57) ABSTRACT

A timing adjustment circuit is used for a semiconductor test system having a plurality of test stations for testing a plurality of semiconductor devices in parallel at the same time. The timing adjustment circuit includes a wave formatter for commonly providing a test signal, a first variable delay circuit connected to the wave formatter, a plurality of second variable delay circuits each of which is connected to one of the plurality of test stations, a first data latch for holding delay data for the first variable delay circuit when timings in the plurality of test stations match one another, a plurality of second data latches for separately holding delay data for the plurality of second variable delay circuits, a counter for generating the delay data by counting a system clock in which higher bits of the delay data is provided to the first variable delay circuit and lower bits of the delay data being provided to the plurality of second variable delay circuits, a lower bit AND circuit for detecting a state in which all of the lower bits of the delay data are in the same logic state, a detection circuit for detecting a signal arrival in each of the plurality of test stations based on the test signal, and a delay data control circuit to send latch command signals to each of the second data latches and to the first data latch.

9 Claims, 4 Drawing Sheets

TIMING ADJUSTMENT CIRCUIT FOR SEMICONDUCTOR TEST SYSTEM

FIELD OF THE INVENTION

This invention relates to a timing adjustment circuit for a semiconductor test system, and more particularly, to a timing phase adjustment circuit to adjust, within a short period of time, the timing differences between a plurality of test stations for simultaneously testing a plurality of IC devices in parallel.

BACKGROUND OF THE INVENTION

In testing a semiconductor device by a semiconductor test system, the semiconductor test system provides test signals to the semiconductor device under test and compare the resulting output of the device under test with expected data to determine whether the semiconductor device works correctly or not. Since the modern semiconductor device, such as an LSI (large scale integrated circuit), has a large number of input-output pins, a semiconductor test system also has a large number of test channels corresponding to the pins of the semiconductor device to be tested.

In the semiconductor test industry, it is a common practice to test a plurality of semiconductor devices which have a relatively small number of pins by a semiconductor test system in parallel at the same time. One of the reasons is that a semiconductor test system has a large number of test channels to test a semiconductor device having a large number of pins, it is advantageous to divide the test channels to form a plurality of test stations to test a plurality of semiconductor devices at the same time to increase the test efficiency. In testing a plurality of IC devices at the same time by a plurality of test stations, the timings of the test signals among the test stations must be the same, i.e, the timing differences between the test stations must be adjusted to be zero.

FIG. 4 is a block diagram showing a structure of conventional semiconductor test system for testing a plurality of semiconductor devices in parallel at the same time by a plurality of test stations. For convenience of explanation, the example of FIG. 4 is to test two semiconductor devices and shows a test structure corresponding to only one pin $P_{1a}$ and $P_{1b}$ of the two respective semiconductor devices, DUT(a) and DUT(b) to be tested placed on the test stations ST1 and ST2. Thus, it should be noted that similar circuit arrangements are also provided for other pins of DUT(a) and OUT(b) in the actual test system.

The system of FIG. 4 includes a pattern generator 31, a timing generator 32, a wave formatter 33, variable delay circuits $34_a$ and $34_b$, drivers $35_a$ and $35_b$, analog comparators $36_a$ and $36_b$, and logic comparators $38_a$ and $38b$. The pattern generator 31 generates a test signal and expected data. The test signal is provided to the timing generator 32 where the timing of the test signal is determined. The test signal is wave shaped by the wave formatter 33 such as in an RZ waveform or an NRZ waveform. The test signal from the wave formatter 33 is provided to the drivers $35_a$ and $35_b$ through the variable delay circuits $34_a$ and $34_b$. Thus, the test signal is commonly applied to the pins $P_{1a}$ of DUT(a) and $P_{1b}$ of DUT(b).

The outputs of the DUT(a) and DUT(b) are compared with reference voltages (not shown) by the analog comparators $36_a$ and $36_b$ by the timings of strobe signals Sb. The outputs of the analog comparators $36_a$ and $36_b$ are provided to the logic comparators $38_a$ and $38_b$ whereby compared with the expected data from the pattern generator 31. In this arrangement, prior to the actual test of DUT(a) and DUT(b), the timing of the test signals at the pin $P_{1a}$ and $P_{1b}$ must be precisely adjusted.

To adjust the timings between the test stations ST1 and ST2, in the conventional semiconductor test system, delay times of the variable delay circuits $34_a$ and $34_b$ are adjusted by monitoring the timing at the inputs of DUT(a) and DUT(b). Typically, such adjustment of the timing phase is carried out station by station with the use of a test instrument such as an oscilloscope.

In this conventional technology, since the timing in each of the test stations is manually adjusted, the time required for such adjustment increases with an increase of the number of test stations and the number of pins of the devices to be tested. Further, since the variable delay time circuit in each of the station is to adjust the delay time common to all of the stations, the range of varying the delay time is large, which requires many circuit components to realize such range of delay times. Moreover, since the timing adjustment is carried out manually, such adjustment may involve errors such as reading errors caused by an operator.

SUMMARY OF THE INVENTION

It is therefore, an object of the present invention to provide a timing phase adjustment circuit for a semiconductor test system which is capable of automatically adjusting timing differences between a plurality of test stations in a short period of time for testing a plurality of semiconductor devices at the same time.

It is another object of the present invention to provide a timing phase adjustment circuit for a semiconductor test system which is capable of automatically adjusting timing differences between a plurality of test stations while decreasing the circuit components required for variable delay circuits in the semiconductor test system.

It is a further object of the present invention to provide a timing phase adjustment circuit for a semiconductor test system which is capable of automatically adjusting timing differences between a plurality of test stations with high accuracy without involving errors by a user.

The timing adjustment circuit is used for a semiconductor test system having a plurality of test stations for testing a plurality of semiconductor devices in parallel at the same time. The timing adjustment circuit of the present invention is to adjust a timing phase difference between the test stations prior to the testing by including a unique feedback circuit.

The timing adjustment circuit of the present invention includes:

a wave formatter for commonly providing a test signal for adjusting the timing phase difference to the test stations;

a first variable delay circuit connected to an output of the wave formatter;

a plurality of second variable delay circuits each of which is connected to one of the plurality of test stations; a first data latch for holding delay data for the first variable delay circuit when timings in the plurality of test stations match one another;

a plurality of second data latches for separately holding delay data for the plurality of second variable delay circuits; a counter for generating the delay data by counting a system clock, higher bits of the delay data being provided to the first variable delay circuit through the first data latch and lower bits of the delay data being provided to the plurality of second variable delay circuits through the plurality of second data latches;

a lower bit ANO circuit for detecting a state in which all of the lower bits of the delay data are in the same logic state;

a detection circuit for detecting a signal arrival in each of the plurality of test stations based on the test signal; and a delay data control circuit to send a latch command signal to each of the second data latches when receiving a detection signal indicating that the signal arrival in one of the test stations from the detection circuit, the delay data control circuit sending latch command signals to the first data latch and all of the second latches when receiving detection signals indicating that signal arrivals in all of the test stations occur within the same cycle of the system clock.

According to the present invention, the timing phase adjustment circuit for a semiconductor test system automatically adjusts timing differences between a plurality of test stations in a short period of time for testing a plurality of semiconductor devices at the same time. Since the procedure of adjusting the timing phase is done automatically, the timing adjustment will be completed with high accuracy without involving errors caused by a user. Furthermore, the timing phase adjustment circuit of the present invention automatically adjusts the timing differences between a plurality of test stations while decreasing the circuit components required for variable delay circuits in the semiconductor test system.

DETAILED DESCRIPTION OF THE PREFERRED EMBODIMENTS

Figure 1:
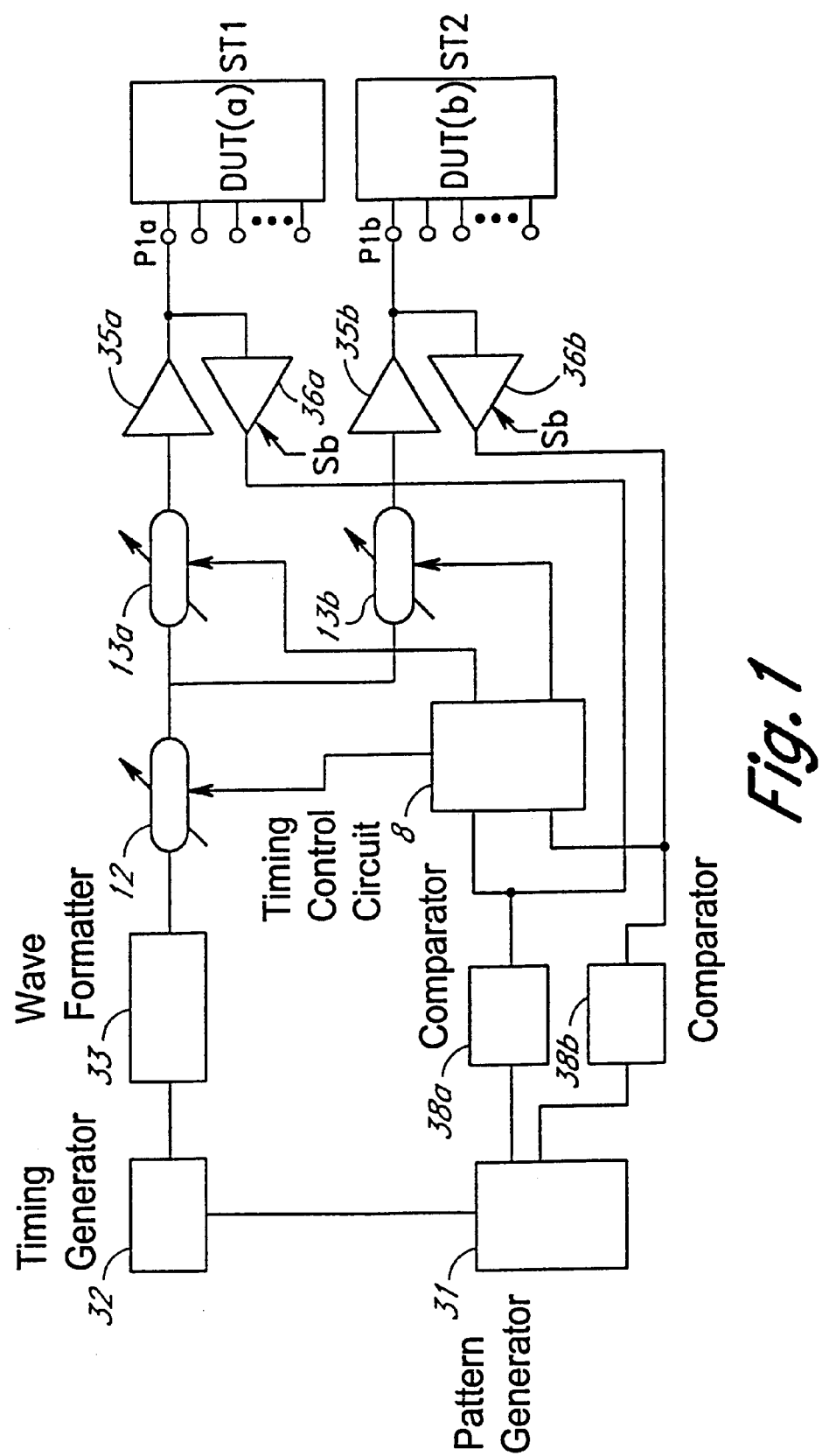
FIG. 1 is a block diagram showing a timing phase adjustment circuit used in a semiconductor test system in accordance with the present invention.
Figure 4:
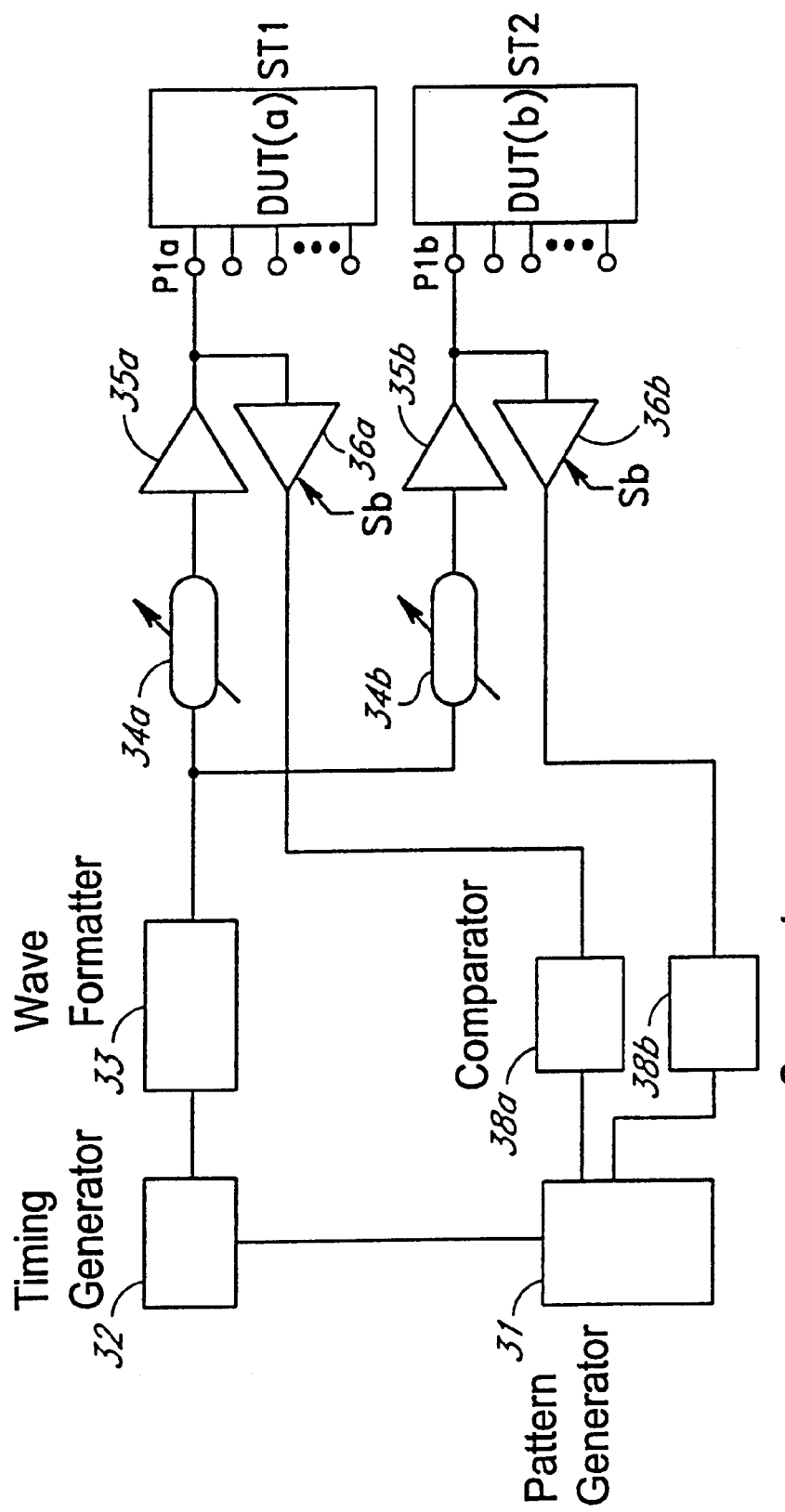
FIG. 4 is a block diagram showing a structure for adjusting timings in a plurality of test stations in the conventional semiconductor test system.

The preferred embodiment of the present invention will be explained with reference to the drawings. FIG. 1 is a block diagram showing a timing phase adjustment circuit used in a semiconductor test system in accordance with the present invention. For the purpose of explanation, the structure of FIG. 1 corresponds to only one pin, i.e., test points $P_{1a}$ and $P_{1b}$ of DUT(a) and DUT(b) as in the case of FIG. 4.

The system of FIG. 1 includes a pattern generator 31, a timing generator 32, a wave formatter 33, a variable delay circuit 12, variable delay circuits $13_a$ and $13_b$, drivers $35_a$ and $35_b$, analog comparators $36_a$ and $36_b$, a timing control circuit 8, and logic comparators $38_a$ and $38_b$. Except for the variable delay circuit 12, $13_a$ and $13_b$ and the timing control circuit 8, the functions of the other blocks in FIG. 1 is the same as those of FIG. 4.

In the arrangement of FIG. 1, prior to the test of DUT(a) and DUT(b), the timings of the test stations ST1 and ST2 are adjusted by the variable delay circuit 12, $13_a$ and $13_b$ and the timing control circuit 8. Such adjustment of the timing phase is performed automatically in the present invention as will be described in detail below. The timing control circuit 8 detects the outputs of the analog comparators $36_a$ and $36_b$ and automatically sets the delay time of the variable delay circuit 12, $13_a$ and $13_b$. The outputs of the analog comparators $36_a$ and $36_b$ determine whether the test signal has arrived at the comparators at the time of the strobe signals Sb.

Figure 2:
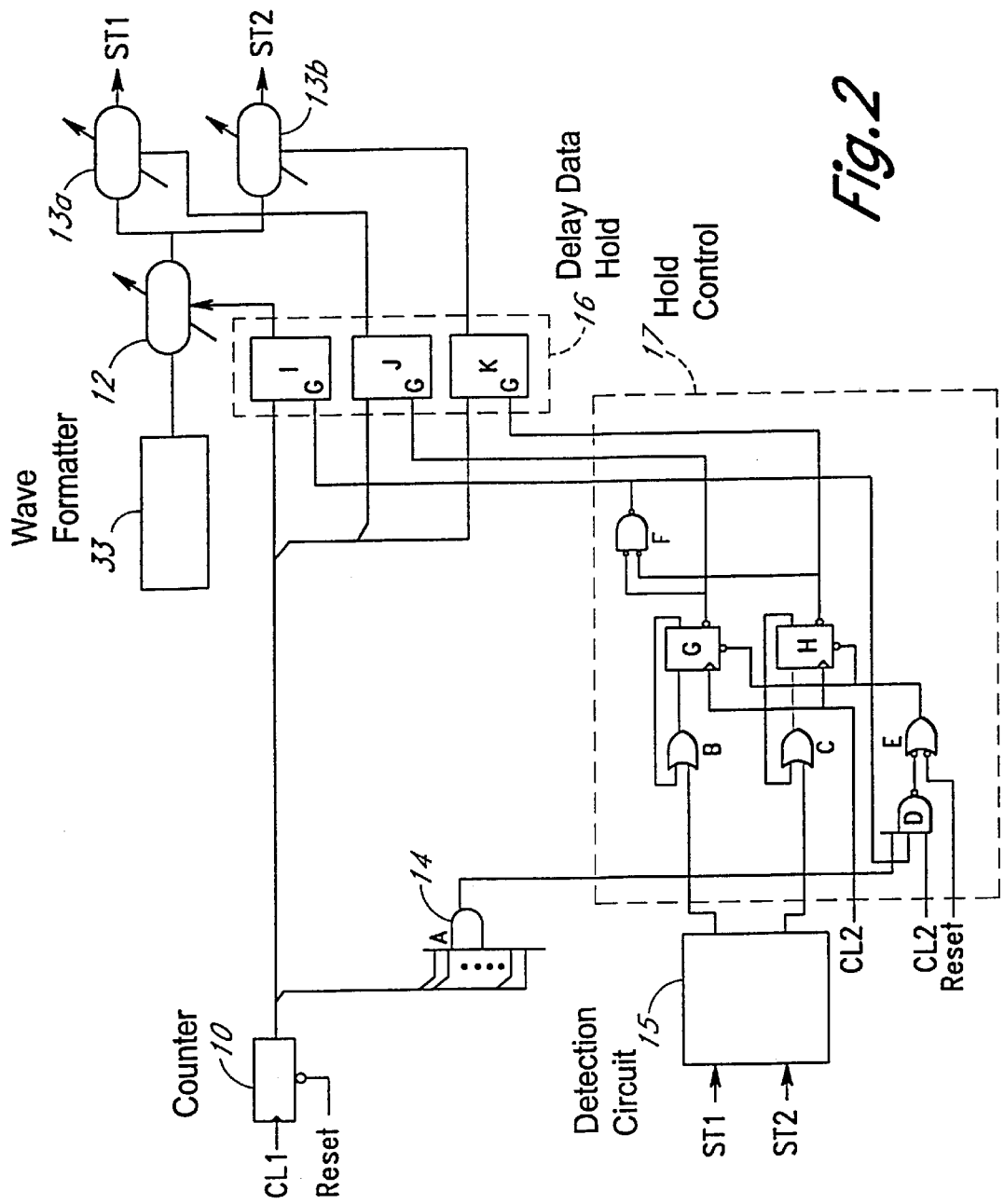
FIG. 2 is a circuit diagram showing a detailed view of the timing phase adjustment circuit of the present invention applied to an example of semiconductor test system having two test stations.

FIG. 2 is a circuit diagram showing a detailed view of the timing phase adjustment circuit of the present invention applied to an example of semiconductor test system for testing semiconductor devices in the two test stations ST1 and ST2. The timing phase adjustment circuit includes a counter 10, the wave formatter 33, the variable delay circuit 12, the variable delay circuits $13_a$ and $13_b$ for test stations ST1 and ST2, respectively, a lower bit AND circuit 14, a detection circuit 15, a delay data hold circuit 16, and a delay data hold control circuit 17.

It should be noted that the circuit structure shown in FIG. 2 is for one common pin (test point) $P_{1a}$ and $P_{1b}$ of semiconductor devices to be tested, i.e., one test channel of the semiconductor test system. Thus, when applying the present invention to an actual test system, a plurality of circuits shown in FIG. 2 should be used corresponding to the number of test channels.

The wave formatter 33 generates a test signal based on a timing signal from the timing generator shown in FIG. 1 in synchronism with a system clock. In this case, the test signal from the formatter 33 is used for the purpose of adjusting the timings in the test stations ST1 and ST2 according to the present invention. After the timing adjustment, the wave formatter 33 will provide an actual test signal to the semiconductor devices DUT(a) and DUT(b) to be tested mounted on the test stations ST1 and ST2.

The variable delay circuit 12 is provided in the main system while the variable delay circuits $13_a$ and $13_b$ are provided in the test stations ST1 and ST2. Thus, the delay time in the variable delay circuit 12 will be added to each of the delay times in the test stations ST1 and ST2. The variable delay circuits 12, $13_a$ and $13_b$ are provided with digital data from the delay data hold circuit 16 to produce delay times indicated by the digital data.

In the arrangement of FIG. 2, as shown in FIG. 1, the test signals passing through the delay circuits $13_a$ and $13_b$ in the test stations ST1 and ST2 reach the test points $P_{1a}$ and $P_{1b}$ where the pin of the semiconductor devices DUT(a) and DUT(b) are placed and return to the detection circuit 15 through the comparators $36_a$ and $36_b$. Therefore, to adjust the timings of the two test stations ST1 and ST2 to be the same regarding certain corresponding pins (test channels) means that the signals returned to the detection circuit 15 are synchronized with each other.

The counter 10 increments its output by one in synchronism with the system clock. The output of the counter 10 consists of a plurality of bits, such as 16-bit to express delay data incremented by the system clock. The output of the counter is connected to the delay data hold circuit 16. As shown in FIG. 2, in this example, the delay data hold circuit 16 has three latches I, J and K. The latch I provides the delay data to the variable delay circuit 12 in the main system. The latches J and K respectively provide the delay data to the variable delay circuits $13_a$ and $13_b$ in the test stations ST1 and ST2.

The lower bits of the output of the counter, for example, 8 bits are provided to the lower bit AND circuit 14. The lower 8 bits are also connected to both the latches J and K in the delay data hold circuit 16. The higher bits of the output of the counter 10, for example, 8 bits are provided to the latch I in the delay data hold circuit 16. The lower bit AND circuit 14 changes its output state when all of the lower 8 bits turn to "1". The output of the lower bit AND circuit 14 is connected to the delay data hold control circuit 17. The output of the lower bit AND circuit 14 functions to reset the delay data in the latches J and K in the delay data hold circuit 16, which will be described in more detail later.

In this example, the delay data hold control circuit 17 has three outputs each of which is connected to the corresponding latch in the delay data hold circuit 16. When this output is provided, for example, in a high level (latch command), the delay data in the latches are held unchanged while in a low level, the delay data changes sequentially by the output of the counter 10 in synchronism with the system clock. When both the latches J and K are instructed to hold the respective delay data by the delay data hold control circuit 17, the latch I will also be instructed to hold the delay data, since the timings in the two stations ST1 and ST2 match with each other in this situation.

The detection circuit 15 receives the test signals returned from the test stations ST1 and ST2 to detect the changes of the comparator outputs. When it is interested in a rising edge of the test signals, the comparator detects the changes in the low to high level in both of the test signals. Conversely, when it is interested in the falling edge of the test signal, the comparator will detect the change in the test signals from the high level to the low level. When the change is detected in the outputs of the comparators $36_a$ or $36_b$, the detection circuit 15 sends a detection signal to the delay data hold control circuit 17.

As noted above, when both the two test signals to the comparator change their states at the same time, it means that the timing phases are adjusted to be the same. Thus, the timing phase adjustment process will end by holding all the delay data at that time to fix the delay time in the variable delay circuits 12, $13_a$ and $13_b$. Then, an actual test will start in parallel for the plurality of semiconductor devices placed on the test stations.

The delay data hold control circuit 17 includes registers G and H. The outputs of the registers G and H are respectively connected to the latches J and K in the delay data hold circuit 16. The registers G and H receive the outputs of the detection circuit 15 through OR gates B and C. The inputs of the OR gates B and C are connected to the outputs of the registers G and H in a manner shown in FIG. 2. In this circuit arrangement, once a high level output is received from the detection circuit 15, the registers G and or H send a latch command to the corresponding latches J and K to hold the delay data until the registers G and H are reset by a reset signal.

The registers G and H are provided with a system clock so that the latch command will be generated in synchronism with the system clock when the output of the detection circuit 5 goes to the high level. The reset signal for the registers G and H is provided through an OR gate E. Further, an output of the lower bit AND gate 14 functions as the reset signal and is provided to the registers G and H through an AND gate D and the OR gate E.

With reference to the timing chart of FIG. 3, an operation of the timing phase adjustment circuit of FIG. 2 will be explained. One of the features in the operation of the present invention is that delay data for the variable delay circuits $13_a$ and $13_b$ is repeatedly and continuously increased within the lower bits of the delay data shown in the output of the counter 10. When the timings between the test stations ST1 and ST2 agree, the delay times for the variable delay circuits 12, $13_a$ and $13_b$ are fixed.

If there is no timing agreement between the test stations ST1 and ST2 for the delay data of lower bits, 8 bits in this case, the delay time for the variable delay circuit 12 is incremented by the upper bits of the output of the counter 10. The delay data for the variable delay circuits $13_a$ and $13_b$, i.e., the data formed with the lower bits of the output of the counter 10 returns to zero and increments again. This process repeats until both outputs of the detection circuit 15 go to the high level at the same time.

At the beginning of the operation, the counter 10 and the registers G and H are reset by the reset signal of FIG. 3A. By the system clock CL1 of FIG. 3B, the counter 10 is incremented by one at every clock pulse of the system clock CL1 as shown in FIG. 3C. The registers G and H in the delay data hold control circuit 17 take the output data of the detection circuit 15 by the timing of the system clock CL2 of FIG. 3D. The wave formatter 33 generates a test signal of FIG. 3E which is the same repetition rate of the system clock CL1.

The output data of the counter 10 controls the delay time in the variable delay circuits $13_a$ and $13_b$ through the latches J and K. In the example of FIG. 3, when the output data of the counter 10 shows "1", the detection circuit 15 detects the output of the comparator $36_b$, i.e., the test station ST2, and provides a high level output as shown in FIG. 3G. Thus, the register H provides a latch command to the latch K so that the latch K holds the data "1" as shown in FIG. 3I. As a result, the delay time in the variable delay circuit $13_b$ is fixed to the time length indicated by the data "1".

Figure 3:
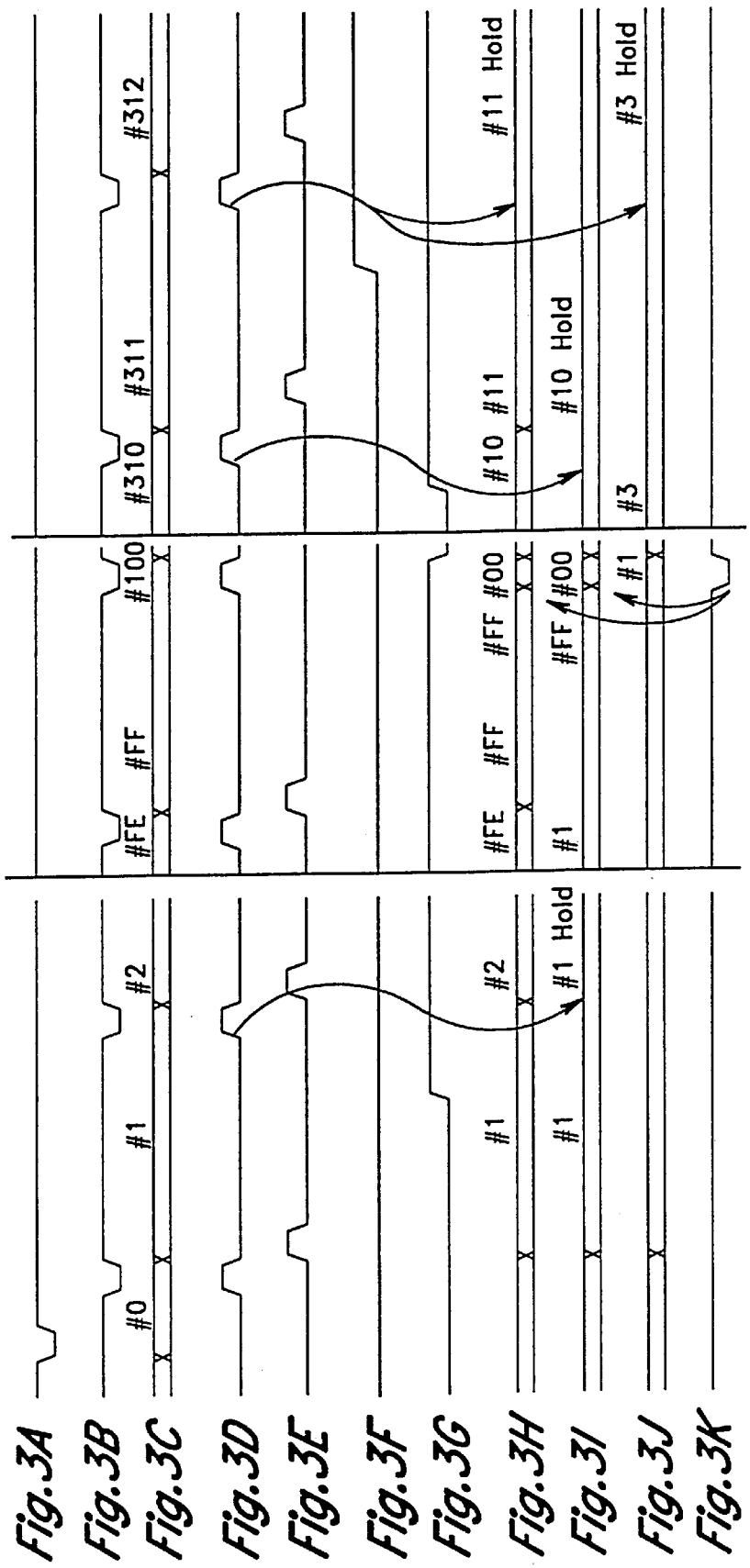
FIGS. 3A–K are timing charts showing an operation of the timing phase adjustment circuit of FIG. 2.

Since the comparator output for the test station ST1 remains the low level as shown in FIG. 3F, the delay data for the variable delay circuit $13_a$ keeps increasing as shown in FIG. 3H. During this procedure in the left side of FIG. 3, since the delay data of the higher bits is unchanged, the output of the latch I is "0" as shown in FIG. 3J. Further, in this situation, since the lower bits of the delay data have not reached the all "1" state, the output of the lower bit AND circuit 14 remains low level as shown in FIG. 3K.

The delay data for the variable delay circuit 13, in the test station ST1 keeps increasing as shown in the middle portion of FIG. 3 since the output of the comparator $36_a$ still in the low level. When the delay data from the counter 10 reaches FF (hexadecimal indicating an all "1" state for lower 8 bits), the lower bit AND circuit 14 generates a detection signal of FIG. 3K which is provided to the registers G and H in the delay data hold control circuit 17 through the OR gate E.

This detection signal from the AND circuit 14 functions as a reset signal to the registers G and H. As a result, the latch command to the latches J and K is removed. Thus, both the latches J and K provide the lower bit delay data starting from zero to the variable delay circuits $13_a$ and $13_b$ as shown in FIGS. 3H and 3I. At the same time, the data of the higher bits of the delay data in the latch I is incremented by one as shown in FIG. 3J which is provided to the variable delay circuit 12.

The above procedure is repeated as in FIG. 3. In the right side of FIG. 3, the test station ST2 is changed to a high level as in FIG. 3G when the delay data is "310" as shown in FIG. 3C. Thus, the delay data hold control circuit 17 sends a latch command to the latch K which holds the delay data "10" of the lower bits as shown in FIG. 3I. When the delay data from the counter 10 indicates "311", the test station ST1 is also changed to a high level as in FIG. 3F when the delay data of FIG. 3C is "311".

Therefore, the delay data hold control circuit 17 sends a latch command to the latch J which holds the delay data "11" in the lower bits as shown in FIG. 3H. In this situation, since timings in the test stations ST1 and ST2 match with each other, the delay data hold control circuit 17 also sends a latch command to the latch I to complete the timing adjustment procedure. Thus, in this example, the latch I holds the delay data "3", the latch K holds the delay data "10" and the latch J holds the delay data "11" for the actual semiconductor test follows.

As has been foregoing, according to the present invention, the timing phase adjustment circuit for a semiconductor test system automatically adjusts timing differences between a plurality of test stations in a short period of time for testing a plurality of semiconductor devices at the same time. Since the procedure of adjusting the timing phase is done automatically, the timing adjustment will be completed with high accuracy without involving errors caused by a user. Furthermore, the timing phase adjustment circuit of the present invention automatically adjusts the timing differences between a plurality of test stations while decreasing the circuit components required for variable delay circuits in the semiconductor test system.

What is claimed is:

1. A timing adjustment circuit for a semiconductor test system having a plurality of test stations for testing a plurality of semiconductor devices in parallel at the same time, said timing adjustment circuit for adjusting a timing phase difference between said test stations prior to the testing, comprising:

a wave formatter for commonly providing a test signal for adjusting said timing phase difference to the test stations;

a first variable delay circuit connected to an output of said wave formatter;

a plurality of second variable delay circuits each of which is connected to one of said plurality of test stations;

a first data latch for holding delay data for said first variable delay circuit when timings in said plurality of test stations match one another;

a plurality of second data latches for separately holding delay data for said plurality of second variable delay circuits;

a counter for generating said delay data by counting a system clock, higher bits of said delay data being provided to said first variable delay circuit through said first data latch and lower bits of said delay data being provided to said plurality of second variable delay circuits through said plurality of second data latches;

a lower bit AND circuit for detecting a state in which all of said lower bits of said delay data are in the same logic state;

a detection circuit for detecting a signal arrival in each of said plurality of test stations based on said test signal; and a delay data control circuit to send a latch command signal to each of said second data latches when receiving a detection signal indicating that said signal arrival in one of said test stations from said detection circuit, said delay data control circuit sending latch command signals to said first data latch and all of said second data latch when receiving detection signals indicating that signal arrival in all of said test stations occur within the same cycle of said system clock.

2. A timing adjustment circuit as defined in claim 1, wherein said delay data control circuit cancels said latch command signal to said second data latches when a signal from said lower bit AND circuit is received which indicates that all of said lower bits of said delay data are in the same logic state.

3. A timing adjustment circuit as defined in claim 1, wherein said delay data to said first variable delay circuit increments while said delay data to said second variable delay circuits returns to zero and increments at every cycle of said system clock when a signal from said lower bit AND circuit is generated.

4. A timing adjustment circuit as defined in claim 1, wherein said delay data control circuit includes a plurality of register circuits corresponding to the number of said plurality of test stations, each of said register circuits provides said latch command signal when receiving said detection signal from said detection circuit and maintains said latch command signal until receiving a reset signal from an external source or a signal from said lower bit AND circuit indicating that all of said lower bits of said delay data are in the same logic state.

5. A timing adjustment circuit as defined in claim 1, wherein each of said test stations includes a comparator circuit which compares said test signal with a reference voltage at a timing of a strobe signal, an output of said comparator circuit is connected to said detection circuit to indicate said signal arrival in said test station with respect to said timing of said strobe signal.

6. A timing adjustment circuit as defined in claim 1, wherein said wave formatter generates said test signal under the control of a pattern generator which generates a test signal pattern and expected data for testing said semiconductor devices.

7. A timing adjustment circuit as defined in claim 1, wherein said lower bits of said delay data is eight bits of said output of said counter.

8. A timing adjustment circuit as defined in claim 1, wherein said first variable delay circuit provides a delay time common to all of said plurality of test stations and each of said second variable delay circuit provides a delay time for corresponding one of said test stations.

9. A timing adjustment circuit for a semiconductor test system having a plurality of test stations for testing a plurality of semiconductor devices in parallel at the same time, said timing adjustment circuit for adjusting a timing phase difference between said test stations prior to the testing, comprising:

means for commonly providing a test signal for adjusting said timing phase difference to the test stations;

a first variable delay circuit connected to an output of said wave formatter;

a plurality of second variable delay circuits each of which is connected to one of said plurality of test stations;

a first data latch for holding delay data for said first variable delay circuit when timings in said plurality of test stations match one another;

a plurality of second data latches for separately holding delay data for said plurality of second variable delay circuits;

means for generating said delay data in synchronism with a system clock, higher bits of said delay data being provided to said first variable delay circuit through said first data latch and lower bits of said delay data being provided to said plurality of second variable delay circuits through said plurality of second data latches;

means for detecting a state in which all of said lower bits of said delay data are in the same logic state;

means for detecting a timing indicating an arrival of said test signal to a comparator circuit in said test station with respect to a strobe signal; and a delay data control circuit to send a latch command signal to each of said second data latches when receiving a detection signal indicating that said signal arrival in one of said test stations, said delay data control circuit sending latch command signals to said first data latch and all of said second data latch when receiving detection signals indicating that signal arrival in all of said test stations occur within the same cycle of said system clock.

* * * * *